US007960812B2

(12) United States Patent
Carberry et al.

(10) Patent No.: US 7,960,812 B2
(45) Date of Patent: Jun. 14, 2011

(54) ELECTRICAL DEVICES HAVING ADJUSTABLE CAPACITANCE

(75) Inventors: Patrick J. Carberry, Laurys Station, PA (US); Jeffery J. Gilbert, Schwenksville, PA (US)

(73) Assignee: Agere Systems Inc., Allentown, PA (US)

( * ) Notice: Subject to any disclaimer, the term of this patent is extended or adjusted under 35 U.S.C. 154(b) by 231 days.

(21) Appl. No.: 12/253,403

(22) Filed: Oct. 17, 2008

(65) Prior Publication Data

US 2009/0040683 A1 Feb. 12, 2009

Related U.S. Application Data

(62) Division of application No. 10/746,824, filed on Dec. 24, 2003, now Pat. No. 7,456,716.

(51) Int. Cl.
*H01L 29/84* (2006.01)

(52) U.S. Cl. .......... 257/532; 257/E29.324; 257/E29.342

(58) Field of Classification Search ............ 257/E29.342
See application file for complete search history.

(56) References Cited

U.S. PATENT DOCUMENTS 5,159,316 A * 10/1992 Lazzara .................... 340/568.2
6,667,725 B1 * 12/2003 Simons et al. ................ 343/895

* cited by examiner

*Primary Examiner* — Stephen W Smoot
(74) *Attorney, Agent, or Firm* — Ryan, Mason & Lewis, LLP

(57) ABSTRACT

Electrical devices having tunable capacitance are provided. The tunable capacitance is achieved by placing an appropriate material between substrate layers and by controllably applying a pressure to the material to compress the material or alter the shape of a well in which the material is contained, and thereby alter the capacitance of the electrical device. The composition, shape and dimension of the embedded materials determine how the capacitance of the electrical device is altered upon compression of the embedded material in response to an applied control signal. Generally, as the embedded material is compressed, the material will become more dense and the capacitance of the integrated electrical device is altered.

14 Claims, 2 Drawing Sheets

ELECTRICAL DEVICES HAVING ADJUSTABLE CAPACITANCE

CROSS-REFERENCE TO RELATED APPLICATIONS

This application is a divisional of U.S. patent application Ser. No. 10/746,824 (now U.S. Pat. No. 7,456,716), filed Dec. 24, 2003, incorporated by reference herein.

FIELD OF THE INVENTION

The present invention relates generally to integrated electronic components and, more particularly, to integrated electronic elements that provide adjustable electrical characteristics.

BACKGROUND OF THE INVENTION

The fabrication of electrical devices, such as resistors, capacitors, and inductors, in integrated devices is well known. Typically, integrated electrical devices are formed by embedding appropriate materials in a substrate. The resulting integrated electrical device typically has relatively fixed electrical characteristics. However, in many applications, the electrical characteristics of such devices must be varied, depending upon the requirements of the given application, including feedback from the output or other circuit requirements to vary the electrical characteristics. Thus, a number of techniques have been proposed or suggested for varying the electrical characteristics of integrated electrical devices in order to maintain the electrical characteristics within specified limits. U.S. Pat. No. 5,543,765, for example, discloses electronic elements having variable electrical characteristics. The electronic elements include a cavity in which a moving insulator element shifts. The moving insulator element is partially covered with an electrically conductive material. An electrical field shifts the moving element to thereby vary the electrical characteristics of the electronic element.

While such proposed techniques may provide a mechanism for maintaining electrical characteristics within a specified range, they often have power or surface area requirements (or both) that are not practical within the constraints of commercially viable integrated devices. A need therefore exists for improved techniques for varying the electrical characteristics of integrated electrical devices in both real time and/or with a feedback mechanism

SUMMARY OF THE INVENTION

Generally, electrical devices having tunable capacitance are provided. The tunable capacitance is achieved by placing an appropriate material between substrate layers and by controllably applying a pressure to the material to compress the material or alter the shape of a well in which the material is contained, and thereby alter the electrical characteristics of the electrical device. The composition, shape and dimension of the embedded materials determine how the capacitance of the electrical device is altered upon compression of the embedded material in response to an applied control signal. Generally, as the embedded material is compressed, the material will become more dense and the capacitance of the integrated electrical device is altered.

A more complete understanding of the present invention, as well as further features and advantages of the present invention, will be obtained by reference to the following detailed description and drawings.

DETAILED DESCRIPTION

Figure 1A:
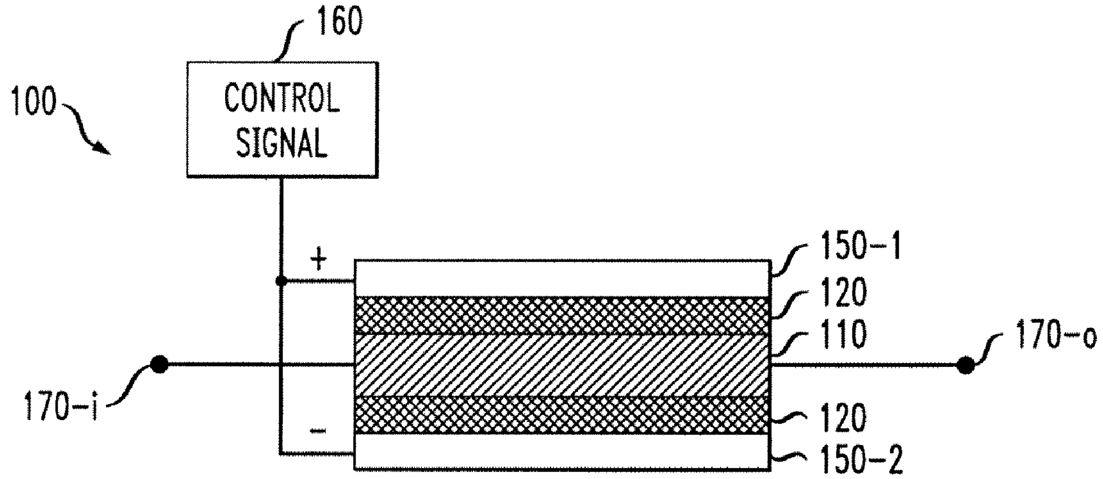
FIGS. 1A and 1B are schematic diagrams of an exemplary integrated resistive device having a tunable resistance value in accordance with the present invention in an uncompressed and compressed state, respectively.
Figure 1B:
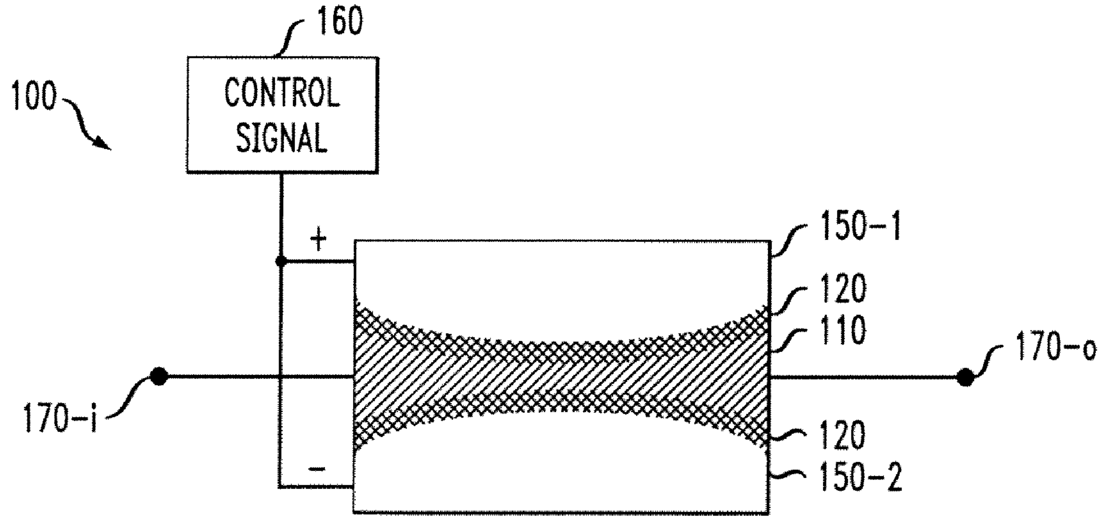

FIGS. 1A and 1B are schematic diagrams of an exemplary integrated resistive device 100 having tunable electrical characteristics in accordance with the present invention in an uncompressed and compressed state, respectively. As shown in FIG. 1A, the exemplary integrated resistive device 100 includes a material 110 embedded in a substrate 120. According to one aspect of the invention, one or more pressure plates 150-1 and 150-2 are applied to the substrate 120 in order to compress the material 110 and thereby alter the resistance of the integrated device 100. As discussed hereinafter, a pair of pressure plates 150 is applied to opposite sides of the substrate 120 in the exemplary embodiment. In a further variation, however, a fixed plate (or the substrate itself) can be used on one side of the substrate 120, while a single pressure plate 150 is applied to the opposite side of the substrate 120 to compress the material 110, as would be apparent to a person of ordinary skill in the art. It is noted that the applied pressure can be greater than or less than atmospheric pressure and can include a suction effect.

The pressure plates 150 will selectively compress the embedded material 110 upon application of an appropriate control signal 160 to the pressure plates 150. The pressure plates 150 may be embodied, for example, as bimetallic plates, piezo electric plates or plates controlled by a micro-electrical mechanical system (MEMS). The pressure plates 150 are in one position when a first voltage is applied and in a second position when a second voltage is applied. In the exemplary embodiment shown in FIGS. 1A and 1B, the bimetallic pressure plates 150 will bow upon application of an appropriate control signal 160. In a further variation, a variable scale between the uncompressed and compressed states can be established by application of an appropriate control signal 160 that determines the degree of compression caused by the pressure plates 150, in a known manner. Thus, the control signal 160 determines the extent to which the embedded material 110 is compressed, and the resulting degree to which the electrical characteristic is altered. The control signal 160 can also be supplied by a feedback loop in real time to make automatic adjustments based upon the signal and or circuit requirements. For example, for the integrated resistive device 100 shown in FIGS. 1A and 1B, the control signal 160 determines the extent to which the embedded material 110 is compressed, and the resulting degree to which the resistance of the integrated resistive device 100 is altered.

According to one aspect of the present invention, the resistance of the integrated device 110 will vary depending on whether the integrated device 110 is in an uncompressed or compressed state, or an intermediate state in between. As shown in FIGS. 1A and 1B, a signal passing between input and output terminals 170-*i* and 170-*o*, respectively, through the embedded material 110 will incur a corresponding voltage drop across the integrated device 110 depending on whether the device 110 is in an uncompressed or compressed state. For example, the integrated device 110 may have a resistance value of 10 ohms in an uncompressed state and a resistance value of 100 ohms in a compressed state.

In yet another variation of the present invention, the compression applied by the pressure plates 150 may be done continuously or intermittently. A continuous compression will introduce a different change in the electrical characteristics of the integrated electrical device than the vibration effect caused by an intermittent pressure. The pressure plates 150 may thus be controlled by transducers or similar devices that allow the pressure plates 150 to vibrate at a desired frequency. The shape of cavity in which the material 110 is retained may also be selected to achieve different results.

As previously indicated, a material 110 is placed inside the layers of the substrate 120. As a signal passes through the material 110, a particular electrical characteristic of the integrated device is varied as the material is compressed. In one exemplary implementation of an integrated resistive device 100, the material 110 may be a copper (Cu) paste or silver (Ag) paste. The resistance material can be mixed with Carbon (C) and a suspension compound to keep the finished material in a grease or gel state. The resistance value can be adjusted from 1 ohm up to 1 mega-ohm depending on the formulation. Generally, the material 110 is selected so that the response to the signal and the mechanical action is sufficient to produce the range of variation in the electrical characteristic which is required.

Figure 2A:
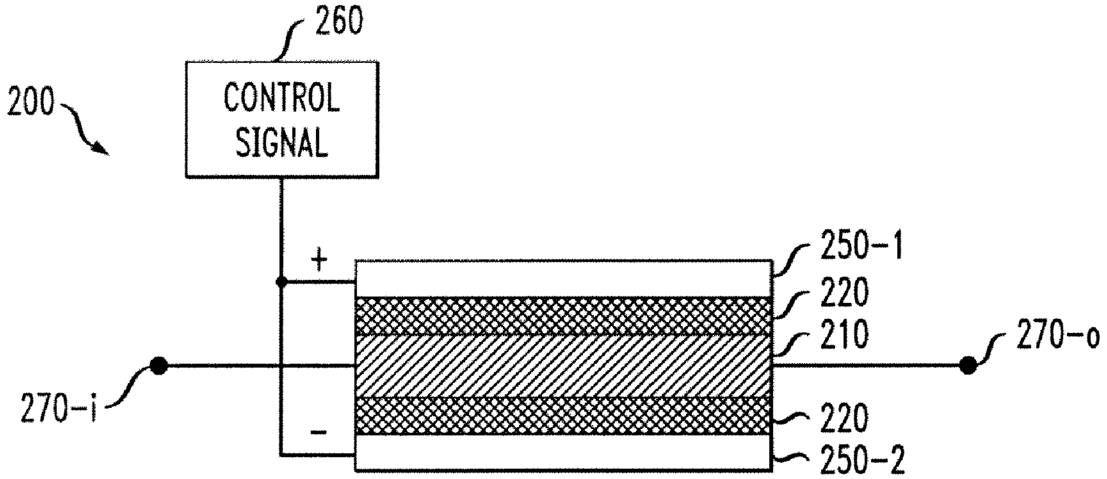
FIGS. 2A and 2B are schematic diagrams of an exemplary integrated capacitive device having a tunable capacitance in accordance with the present invention in an uncompressed and compressed state, respectively.
Figure 2B:
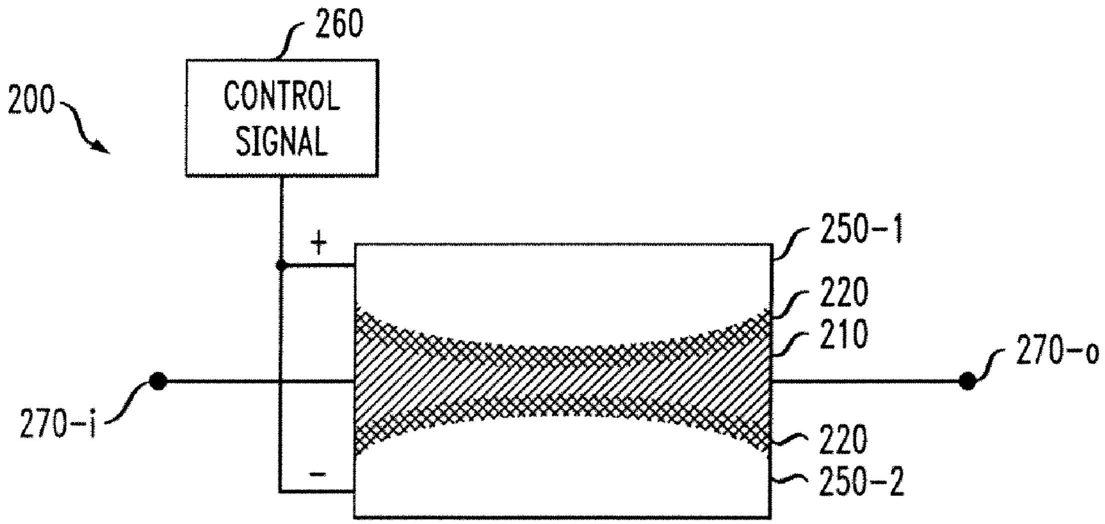

FIGS. 2A and 2B are schematic diagrams of an exemplary integrated capacitive device 200 having tunable electrical characteristics in accordance with the present invention in an uncompressed and compressed state, respectively. As shown in FIG. 2A, the exemplary integrated capacitive device 200 includes a material 210 embedded in a substrate 220. According to one aspect of the invention, one or more pressure plates 250-2 and 250-2 are applied to the substrate 220 in order to compress the material 210 and thereby alter the capacitance of the integrated device 200. The pressure plates 250 may be applied to opposite sides of the substrate 220 or a fixed plate (or the substrate itself) can be used on one side of the substrate 220, while a single pressure plate 250 is applied to the opposite side of the substrate 220 to compress the material 210, as would be apparent to a person of ordinary skill in the art.

The pressure plates 250 will selectively compress the embedded material 210 upon application of an appropriate control signal 260 to the pressure plates 250. The pressure plates 250 may be embodied, for example, as bimetallic plates, piezo electric plates or plates controlled by a micro-electrical mechanical system (MEMS). The pressure plates 250 are in one position when a first voltage is applied and in a second position when a second voltage is applied. In the exemplary embodiment shown in FIGS. 2A and 2B, the bimetallic pressure plates 250 will bow upon application of an appropriate control signal 260. The control signal 260 determines the extent to which the embedded material 210 is compressed, and the resulting degree to which the capacitance is altered.

According to another aspect of the present invention, the capacitance of the integrated device 220 will vary depending on whether the integrated device 220 is in an uncompressed or compressed state, or an intermediate state in between. As shown in FIGS. 2A and 2B, an input signal passes between input and output terminals 270-*i* and 270-*o*, respectively, and the embedded material 210 provides a corresponding capacitance depending on whether the device 220 is in an uncompressed or compressed state. For example, the integrated device 220 may have a capacitance value of 20 Picofarads in an uncompressed state and a capacitance value of 100 microfarads in a compressed state.

In yet another variation of the present invention, the compression applied by the pressure plates 250 may be done continuously or intermittently. A continuous compression will introduce a different change in the electrical characteristics of the integrated electrical device than the vibration effect caused by an intermittent pressure. The pressure plates 250 may thus be controlled by transducers or similar devices that allow the pressure plates 250 to vibrate at a desired frequency. The shape of cavity in which the material 210 is retained may also be selected to achieve different results.

As previously indicated, a material 210 is placed inside the layers of the substrate 220. As a signal passes through the material 210, the capacitance of the integrated device is varied as the material is compressed. In one exemplary implementation of an integrated device 200, the material 210 may be comprised of a dielectric material. The dielectric material can be in a grease or gel state. The capacitance value can be adjusted from Picofarads up to microfarads depending on the formulation. Generally, the material 210 is selected so that the response to the signal and the mechanical action is sufficient to produce the range of variation in the capacitance that is required. The capacitance material would be potentially anything from an air gap with parallel plates, ceramic materials, glass, tantalum oxide and different dopants added to Silicon.

In addition to the resistive and capacitive devices 100, 200, discussed above in conjunction with FIGS. 1 and 2, respectively, an integrated inductance can be fabricated in accordance with the principles of the present invention, as would be apparent to a person of ordinary skill in the art. The embedded material is selected so that the response to the signal and the mechanical action is sufficient to produce the range of variation in the inductance value that is required. Currently, there are many iron filled materials used to produce magnetic fields and to vary the magnetic field base upon the shape of the material will then cause the inductance to also vary.

It is to be understood that the embodiments and variations shown and described herein are merely illustrative of the principles of this invention and that various modifications may be implemented by those skilled in the art without departing from the scope and spirit of the invention.

We claim:

1. An electrical device, comprising:

a substrate;

one or more pressure plates to selectively compress said substrate based on a control signal; and a material embedded in said substrate such that a capacitance value of said electrical device is altered upon a compression of said material by said one or more pressure plates.

2. The electrical device of claim 1, wherein said material is selected to provide a desired range of variation in said capacitance value upon application of an appropriate compression of said material.

3. The electrical device of claim 1, wherein said one or more pressure plates are bimetallic plates.

4. The electrical device of claim 1, wherein said one or more pressure plates are piezo electric plates.

5. The electrical device of claim 1, wherein said one or more pressure plates are controlled by a micro-electrical mechanical system (MEMS).

6. The electrical device of claim 1, wherein said compression is continuously applied to said material.

7. The electrical device of claim 1, wherein said compression is intermittently applied to said material.

8. The electrical device of claim 1, wherein said electrical device is an integrated circuit.

9. The electrical device of claim 1, wherein said electrical device is formed on said substrate.

10. An electrical device, comprising:

a substrate that forms a well in said electrical device;

one or more pressure plates to selectively compress said substrate and alter a shape of said well based on a control signal; and a material embedded in said well such that a capacitance value of said electrical device is altered upon altering a shape of said well by said one or more pressure plates.

11. The electrical device of claim 10, wherein said material is selected to provide a desired range of variation in said capacitance value upon application of an appropriate compression of said material.

12. The electrical device of claim 10, wherein said one or more pressure plates are one or more of bimetallic plates and piezo electric plates.

13. The electrical device of claim 10, wherein said one or more pressure plates are controlled by a micro-electrical mechanical system (MEMS).

14. The electrical device of claim 10, wherein said electrical device is formed on said substrate.

* * * * *